(12) United States Patent
Glenn

(10) Patent No.: US 7,834,927 B2
(45) Date of Patent: Nov. 16, 2010

(54) APPARATUS AND METHOD FOR PRODUCING VIDEO SIGNALS

(75) Inventor: William E. Glenn, Lighthouse Point, FL (US)

(73) Assignee: Florida Atlantic University, Boca Raton, FL (US)

( * ) Notice: Subject to any disclaimer, the term of this patent is extended or adjusted under 35 U.S.C. 154(b) by 29 days.

(21) Appl. No.: 12/221,455

(22) Filed: Aug. 1, 2008

(65) Prior Publication Data

US 2009/0040362 A1    Feb. 12, 2009

Related U.S. Application Data

(63) Continuation-in-part of application No. 10/360,571, filed on Feb. 6, 2003, now Pat. No. 7,408,584, which is a continuation-in-part of application No. 10/227,597, filed on Aug. 22, 2002, now Pat. No. 7,202,900.

(60) Provisional application No. 60/355,346, filed on Feb. 6, 2002, provisional application No. 60/314,209, filed on Aug. 22, 2001.

(51) Int. Cl.
*H04N 5/225* (2006.01)
*H01L 31/062* (2006.01)
*H01L 31/113* (2006.01)

(52) U.S. Cl. ............. 348/340; 257/294; 257/432

(58) Field of Classification Search ............. 348/335, 348/340; 257/294, 432; 438/69
See application file for complete search history.

(56) References Cited

U.S. PATENT DOCUMENTS

| 2,222,934 | A | 11/1940 | Blumlein | 348/206 |
|---|---|---|---|---|
| 4,602,289 | A | 7/1986 | Sekine | 348/315 |
| 4,611,243 | A | 9/1986 | Morisawa et al. | 348/342 |
| 4,758,883 | A | 7/1988 | Kawahara et al. | 348/222.1 |
| 4,799,109 | A | 1/1989 | Esser et al. | 358/213.28 |
| 5,194,944 | A | 3/1993 | Uchiyama et al. | 348/223.1 |
| 5,280,347 | A | 1/1994 | Shiraishi et al. | 348/223.1 |
| 5,337,186 | A | 8/1994 | Oikawa et al. | 359/628 |
| 5,805,217 | A | 9/1998 | Lu et al. | 348/273 |
| 5,995,152 | A | 11/1999 | Labuda | 375/240.01 |
| 6,208,382 | B1 | 3/2001 | Glenn | 348/448 |
| 6,249,643 | B1 | 6/2001 | Minura | 386/107 |
| 6,266,093 | B1 | 7/2001 | Glenn | 348/448 |
| 6,577,341 | B1 | 6/2003 | Yamada et al. | 348/272 |
| 6,590,270 | B2 * | 7/2003 | Suzuki | 257/436 |
| 6,831,692 | B1 | 12/2004 | Oda | 348/315 |
| 6,891,568 | B1 | 5/2005 | Glenn | 348/262 |
| 6,943,831 | B2 | 9/2005 | Gallagher et al. | 334/222.1 |

(Continued)

FOREIGN PATENT DOCUMENTS

JP    08-125933    5/1996

*Primary Examiner*—Sinh Tran
*Assistant Examiner*—Daniel M Pasiewicz
(74) *Attorney, Agent, or Firm*—Martin Novack

(57) ABSTRACT

A method is disclosed for producing signals representative of an image of a scene including the following steps: providing an image sensor with a lenticular lens pattern thereon, and projecting the image onto the image sensor via the lenticular lens pattern, the image sensor having a pixel element pattern and the lenticular lens pattern having diamond shaped lenticles and being diagonally oriented with respect to the horizontal scanning direction of the pixel element pattern; and producing image-representative signals by reading out signals from the pixel elements of the image sensor.

12 Claims, 9 Drawing Sheets

U.S. PATENT DOCUMENTS

| | | | |
|---|---|---|---|
| 7,157,759 B2 | 1/2007 | Kobayashi | 257/294 |
| 7,250,973 B2 * | 7/2007 | Dobashi et al. | 348/340 |
| 2001/0052629 A1 * | 12/2001 | Assadi et al. | 257/432 |
| 2002/0140832 A1 | 10/2002 | Summa | 348/273 |
| 2008/0191299 A1 * | 8/2008 | Parks | 257/432 |
| 2009/0027542 A1 * | 1/2009 | Yamamoto et al. | 348/340 |

* cited by examiner

APPARATUS AND METHOD FOR PRODUCING VIDEO SIGNALS

RELATED APPLICATIONS

The present application is a continuation-in-part of U.S. patent application Ser. No. 10/360,571, filed Feb. 6, 2003 now U.S. Pat. No. 7,408,584, which claims priority from U.S. Provisional Patent Application Ser. No. 60/355,346, filed Feb. 6, 2002. The U.S. patent application Ser. No. 10/360,571 is, in turn, a continuation-in-part of U.S. patent application Ser. No. 10/227,597 (now U.S. Pat. No. 7,202,900), filed Aug. 22, 2002, which claims priority from U.S. Provisional Patent Application Ser. No. 60/314,209, filed Aug. 22, 2001.

FIELD OF THE INVENTION

This invention relates to the field of producing video signals, such as for television.

BACKGROUND OF THE INVENTION

As initial background, reference can be made, for example, to my U.S. Pat. Nos. 6,208,382, 6,266,093, 6,891,568, and 7,088,391, all assigned to the same assignee as the present application.

The 720 60 P format for HDTV is almost totally incompatible with the 1080 30I format. However, they both require the same bit rate and produce images with about the same sharpness. The interlaced image suffers from the usual interlace artifacts of interline flicker, line crawl and reduced vertical resolution. Because of the Kell factor in interlaced images, the vertical resolution is not as high as the horizontal resolution. The 720 line format has the disadvantage that a CRT in this format requires a higher horizontal scan frequency. It is one of the objectives hereof to devise a system that combines the advantages of both formats to produce images that are sharper than either one. It is also among the objects hereof to devise improved techniques and apparatus for producing video signals, including improved single sensor cameras and color cameras using lenticular lens arrays.

SUMMARY OF THE INVENTION

In a form of the present invention, a television system uses diagonal sampling as a way of providing progressive scan at 60 FPS at the same bit rate as interlaced scan at 30 FPS, and can be compatible with 1080 line transmissions.

Diagonal sampling reduces the number of pixels in an image by a factor of two. This allows one to increase the frame rate from 30I to 60 P at the same bit rate. The perceived sharpness is actually slightly higher with this scan than with the cardinally sampled interlaced scan. Diagonal sampling matches the performance of the visual system and scene statistics better than cardinal sampling. All other things being equal, the perceived resolution is lowered by 1.4 rather than the two-fold reduction in number of pixels. In addition to this factor, the perceived resolution is further improved by almost a factor of two by going from interlace to progressive scan. The progressive scan does not have the interlace artifacts. The color signals can be derived from the RGB signals and transmitted with every other pixel on every other line. In this way, two color signals can be transmitted with half the bit rate of luminance. The color signals are also diagonally sampled. The display can be, for example, a matrix addressed light valve with the same filter pattern as the camera sensor. Alternatively, a standard color CRT, or a digitally addressed display, or any other suitable display, can be used.

In order to maintain compatibility with interlaced transmissions, a technique of the general type first employed by A. P. Blumlein in England during the 1930's can be used. This was called "synchronous spot wobble." If the spot on a CRT is wobbled vertically by half the line spacing the information from two lines can be displayed by presenting the information from one line when the spot is up and from the other line when the spot is down. This produces a diagonally sampled image. It doubles the number of lines without changing the horizontal resolution of the two lines put together. If the transmission uses this technique, two lines can be transmitted with one horizontal scan. A field line of an interlaced scan can become two frame lines diagonally sampled. In this way a frame can be displayed, for example, every 60th of a second. The display would have all of the advantages of progressive scan. If the display does not have the vertical wobble, the image would look like a normal interlaced image. For digitally addressed displays, the addressing can, for example, display every other pixel on one line followed by the intervening pixels from a line store on the next line.

In a form of the present invention, a method is set forth for producing signals representative of an image of a scene, including the following steps: providing an image sensor with a lenticular lens pattern thereon, and projecting the image onto the image sensor via the lenticular lens pattern; and producing frame pairs as follows: during one frame of a frame pair, outputting pixel values alternately from successive adjacent line pairs of the sensor, starting at an odd numbered line, and, during the other frame of a frame pair, outputting pixel values alternately from successive adjacent line pairs of the sensor, starting at an even numbered line. In a preferred embodiment of this form of the invention, the step of providing an image sensor with a lenticular lens pattern thereon includes providing a lenticular lens pattern having a diagonal configuration. In this embodiment, the step of providing a lenticular lens pattern comprises providing a lens pattern having circular lenticles which are larger than the pixel elements of the image sensor, the lenticles being centered on every other pixel of each line, beginning at an odd numbered pixel on every other line and beginning at an even numbered pixel on the intervening lines.

In another embodiment of this form of the invention, a method is set forth for producing video signals representative of an image of a scene, comprising the following steps: providing an image sensor with a lenticular lens pattern thereon, and projecting the image onto the image sensor via said lenticular lens pattern, said image sensor having a pixel element pattern, said lenticular lens pattern having diamond-shaped lenticles and being diagonally oriented with respect to the horizontal scanning direction of said pixel element pattern; and producing image-representative video signals by reading out signals from the pixel elements of said image sensor. The diamond-shaped lenticles of the embodiment are substantially contiguous along each diagonal of the pattern.

In a further form of the invention, a method is set forth for producing video signals representative of an image of a scene, including the following steps: providing an image sensor having a pixel pattern; providing a color filter pattern; providing a lenticular lens array, and projecting the image onto the image sensor via said lenticular lens array and said color filter pattern, the lenticular lens pattern of said lenticular lens array having diamond-shaped lenticles and being diagonally oriented with respect to the horizontal scanning direction of said pixel element pattern; and producing image-representative video signals by reading out signals from the pixel elements of said image sensor. In an embodiment of this form of the invention, said step of providing an image sensor having a pixel pattern comprises providing diamond shaped groups of sub-pixels, said step of providing a color filter pattern comprises providing a sub-pixel pattern of colors over each group of sub-pixels, and said step of providing a lenticular lens array comprises providing a diamond-shaped lenticle for each sub-pixel. In another embodiment of this form of the invention, said step of providing an image sensor having a pixel pattern comprises providing diamond shaped groups of sub-pixels, and said step of providing a color filter pattern comprises providing a sub-pixel pattern of colors over each group of sub-pixels, and said step of providing a lenticular lens array comprises providing a diamond-shaped lenticle for each group of sub-pixels.

Further features and advantages of the invention will become more readily apparent from the following detailed description when taken in conjunction with the accompanying drawings.

DETAILED DESCRIPTION

Figures 1, 2:
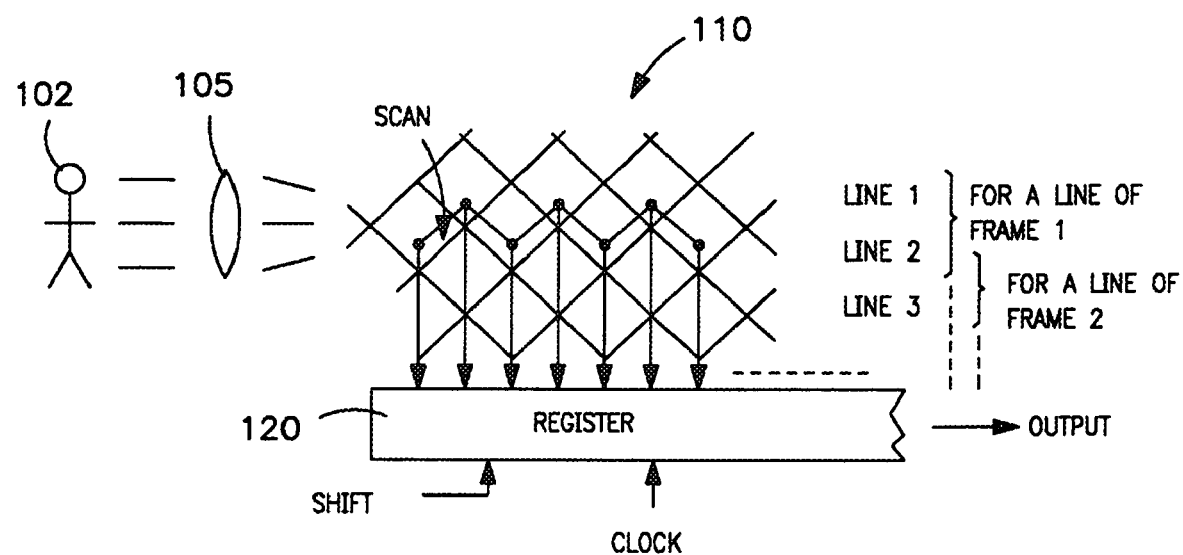
FIG. 1 is a diagram, partially in block form, illustrating an embodiment of the invention for generating video signals.
FIGS. 2, 3 and 4 illustrate operation of another form of the invention for generating video signals.

In FIG. 1, an image, which can be a moving image, from a scene 102, is projected by camera lens system 105 on a diagonally oriented solid state image sensor 110, a representative portion of which is shown in FIG. 1. For a diagonally sampled CCD, the pixels look as shown in the Figure. Lines 1, 2 and 3 are identified in the illustration, which shows how line pairs are clocked into the horizontal register 120 for lines of the first frame and lines of the second frame. The output has the two lines dot sequentially in its output. To make it compatible with interlace, two lines are clocked out at a time during one frame (lines 1 and 2, then 3 and 4, and so on). For the next frame, the register system shifts down one line and clocks out the next line pairs (lines 2 and 3, then 4 and 5, and so on).

Figure 3:
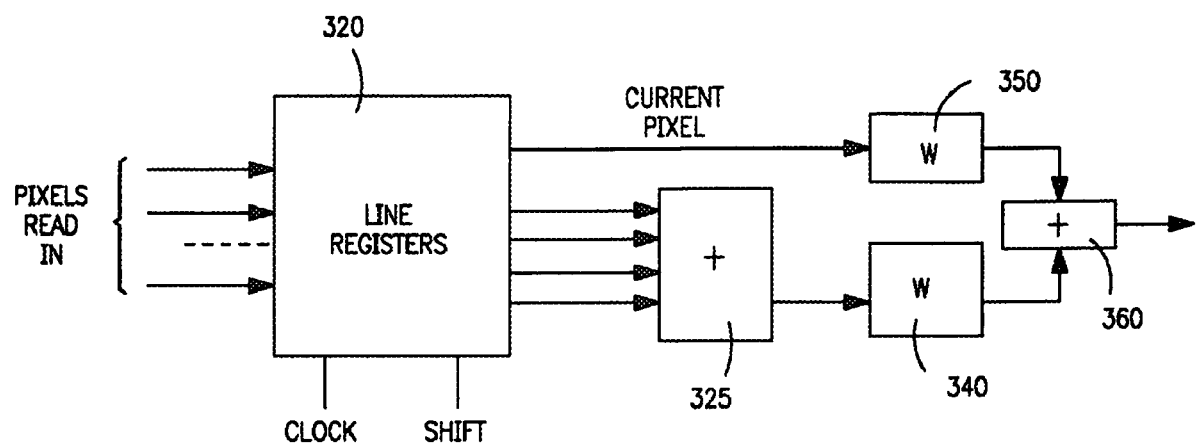
Figure 4:
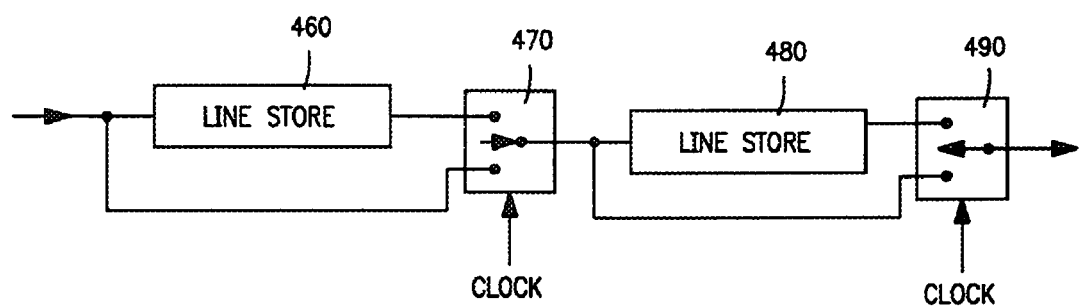

If the signal is to be obtained from a progressively scanned camera at 60 FPS, the signals can be derived from a cardinally sampled image as illustrated in FIGS. 2, 3, and 4. First, a new set of values is calculated for each of the pixels that have X or O. Each of these pixels has added to it the average of the four surrounding pixels. As in FIG. 3, the pixel signals are read into line registers 320. An output thereof, the current pixel (the designated center pixel) is coupled to weighting block 350. Also, the four surrounding pixels (above, below, right, left) are coupled to adder 325 and the sum is weighted (block 340). The output is obtained by summing (block 360) the signals from blocks 340 and 350. The output then leaves out the pixels that don't have X or O with, for example, the approach shown in FIG. 4. In FIG. 4, the input is coupled to line store 460. The input is also coupled to a multiplexer 470, the other input to which is the output of line store 460. This multiplexer is switched at the line rate. The multiplexer 470 output is one input to another line store and is also input to another line store 480. The outputs of multiplexer 470 and line store 480 are coupled to another multiplexer 490 which is switched at the pixel rate. In operation, the multiplexer 470 changes its sense at the frame rate, so that it alternates the odd/even sense of the lines from frame to frame, to make it compatible with interlace. The multiplexer 490 operates at the pixel rate. It alternately clocks out pixels from two adjacent lines.

Figure 5:
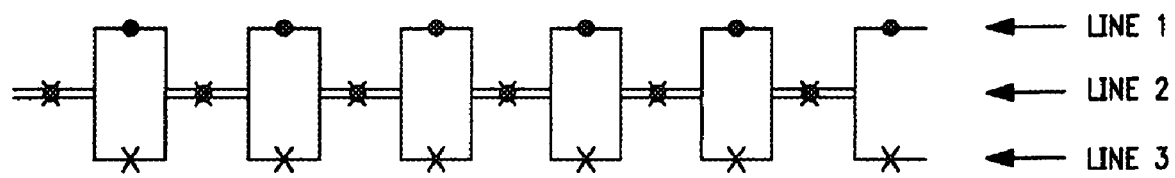
FIG. 5 shows an embodiment for displaying video signals.

For the display, a normal interlaced scan can be used. A small coil on the neck of the CRT can deflect the beam vertically by one frame line at half the clock rate, as illustrated in FIG. 5. Ideally a square wave shape can be used. On one field, lines 1 and 2 are displayed as a pair. On the next field lines 2 and 3 are displayed as a pair, etc.

If a digital LCD or any digital or addressable display is used for the display, it can be advanced in similar fashion to that described for the sensor if the pixels are diagonally sampled.

Figure 6:
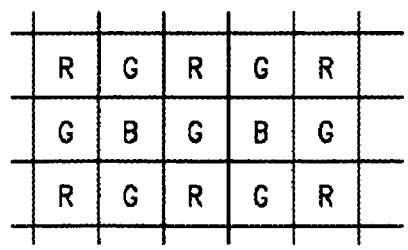
FIGS. 6 and 7 show embodiments that can be used for representative color displays.

If a Bayer pattern display is used, as shown in FIG. 6, then the green pixels are in the diagonal pattern. The red and blue pixels have to be derived and interleaved with the green.

Figure 7:
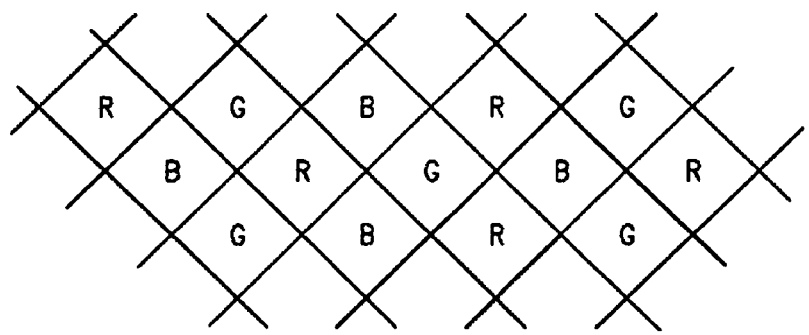

If the diagonal RGB pattern is used, as shown in FIG. 7, then all colors can be written directly.

Figure 8:
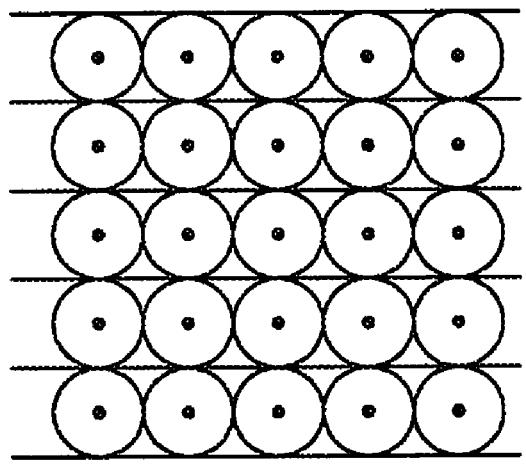
FIG. 8 is a diagram of a lenticular lens pattern on a rectilinear sensor array, with a lens for each pixel sensor element.
Figure 9:
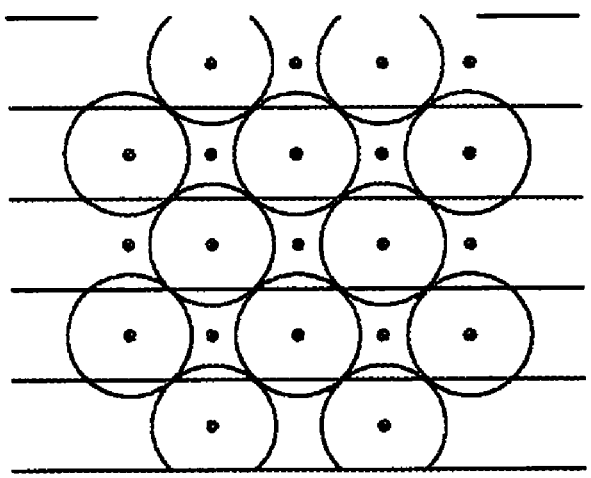
FIG. 9 illustrates an embodiment of the invention which employs, for example, the rectilinear sensor array of FIG. 8, but employing a lenticular lens array that is diagonally oriented with respect to the rectilinear array of sensor elements, and wherein each lenticular is larger than the pixel sensing element of the image sensor.

An interlaced camera interline transfer CCD has a lenticular lens pattern on top of the sensitive area, as shown in FIG. 8. In an embodiment hereof, a lenticular lens pattern with half the number of larger lenses can be placed over the same basic CCD as shown in FIG. 9. It will then have the light from the image focused on the positions of the diagonally sampled pattern. Each lenticle is now twice the area of the ones in FIG. 8. The CCD can still be scanned in the normal interlaced format. The sensitivity will be the same as that of the FIG. 8 version. The output is now the diagonally sampled compatible pattern. Among the advantages, for example, is that a television station can convert to this type of compatible transmission by simply replacing the image sensors with interlaced CCDs having the lenticular pattern of FIG. 9. No other change is necessary in the station. New receivers can now be made that will display either 1080 60 P diagonally sampled or 1080 30 I.

Figure 10:
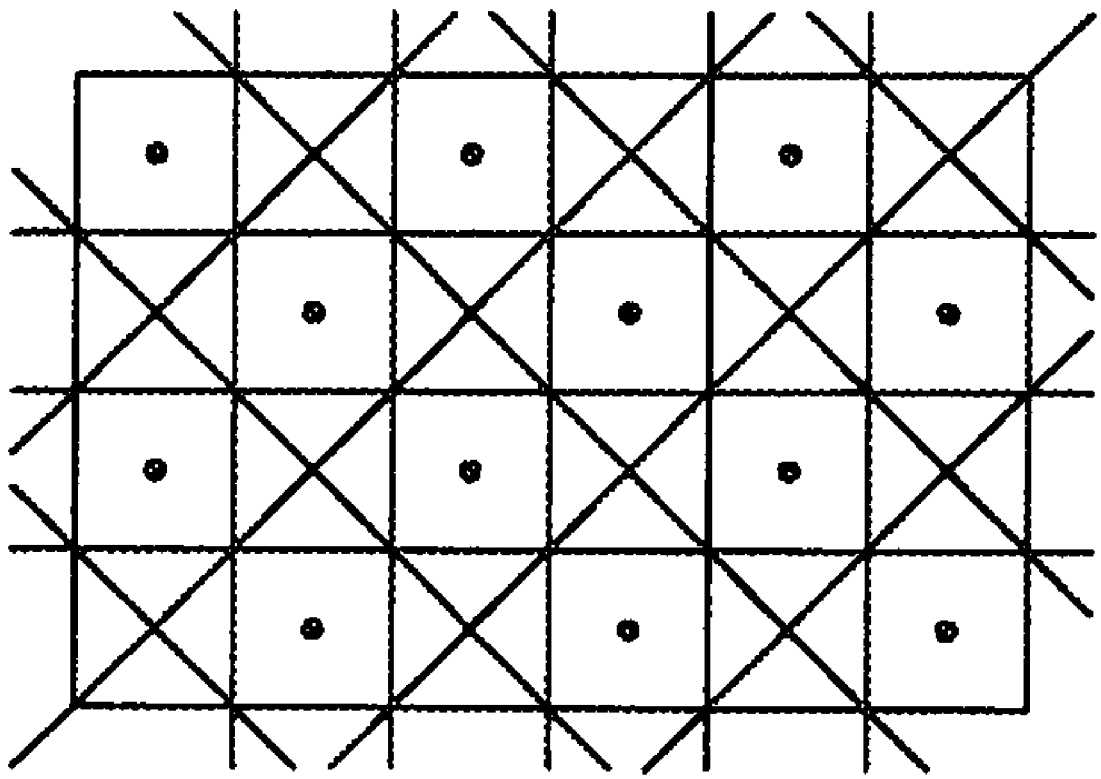
FIG. 10 illustrates another embodiment of an image sensor array and a lenticular lens array.

A lenticular lens pattern with circular lenticles was previously believed to be easier to manufacture. However, other lenticle shapes may be employed, and can be advantageous. As an example, FIG. 10 shows square shaped lenticles in the application of FIG. 9. (The square lenticles, rotated 45 degrees, are referred to as being diamond shaped.) As a further example, hexagonal shapes can be used.

Figure 11:
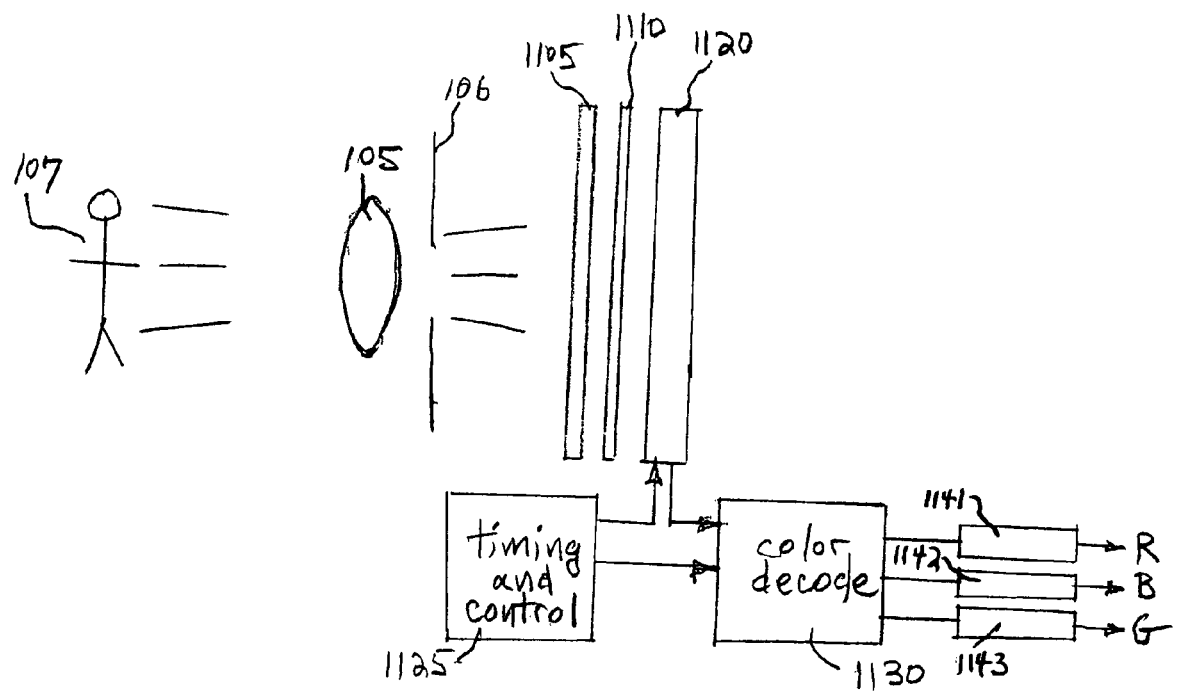
FIG. 11 is a block diagram, partially in schematic form, of apparatus that can be used in practicing embodiments of the invention.

Before further describing embodiments using diamond shaped lenticles, reference can be made to FIG. 11 which shows a system of a type that can be utilized in conjunction with embodiments hereof in practicing the invention. In FIG. 11, the image from scene 102 is projected by camera lens system 105, having aperture 106, onto diagonally oriented solid state image sensor 1120 via lenticular lens array 1105 and color filter pattern 1110. As above, the image sensor can typically comprise a camera sensor chip and associated electronics. The chip is typically under control of timing and control electronics represented at block 1125, and the output thereof is decoded (decoder 1130), in accordance with the pixel and color pattern being used, and coupled into color registers 1141, 1142 and 1143, the outputs of which are respective red, blue and green color component signals. It will be understood that other color components can alternatively be used.

Figure 12:
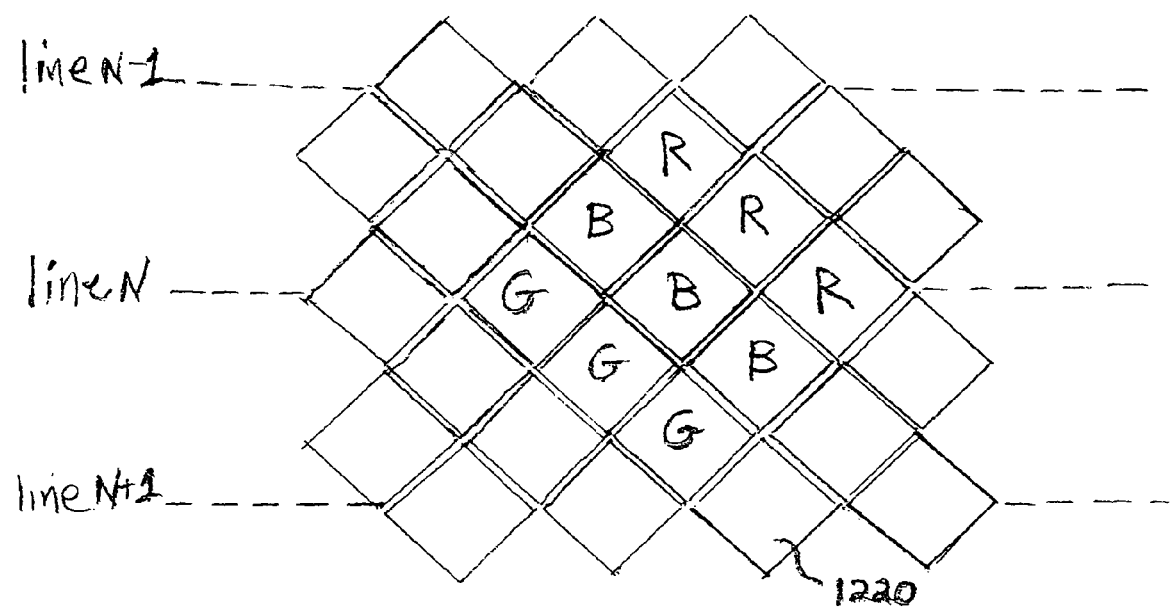
FIG. 12 is a diagram of a portion of a lenticular array, also illustrating color sub-pixels, in accordance with an embodiment of the invention.

FIG. 12 illustrates an embodiment of the invention that utilizes an array of diamond shaped lenticles 1220, each lenticle being contiguous with its adjacent lenticle along the diagonals of the array, with each lenticle therefore being contiguous with all its surrounding neighbors. In this embodiment, each pixel includes a group of nine sub-pixels, as a shown, with the underlying color filter pattern having three sub-pixels for each of red, blue, and green. It will be understood that other color patterns can be used. In this embodiment, each scanline is seen to include three rows of diagonal lenticles.

Figure 13:
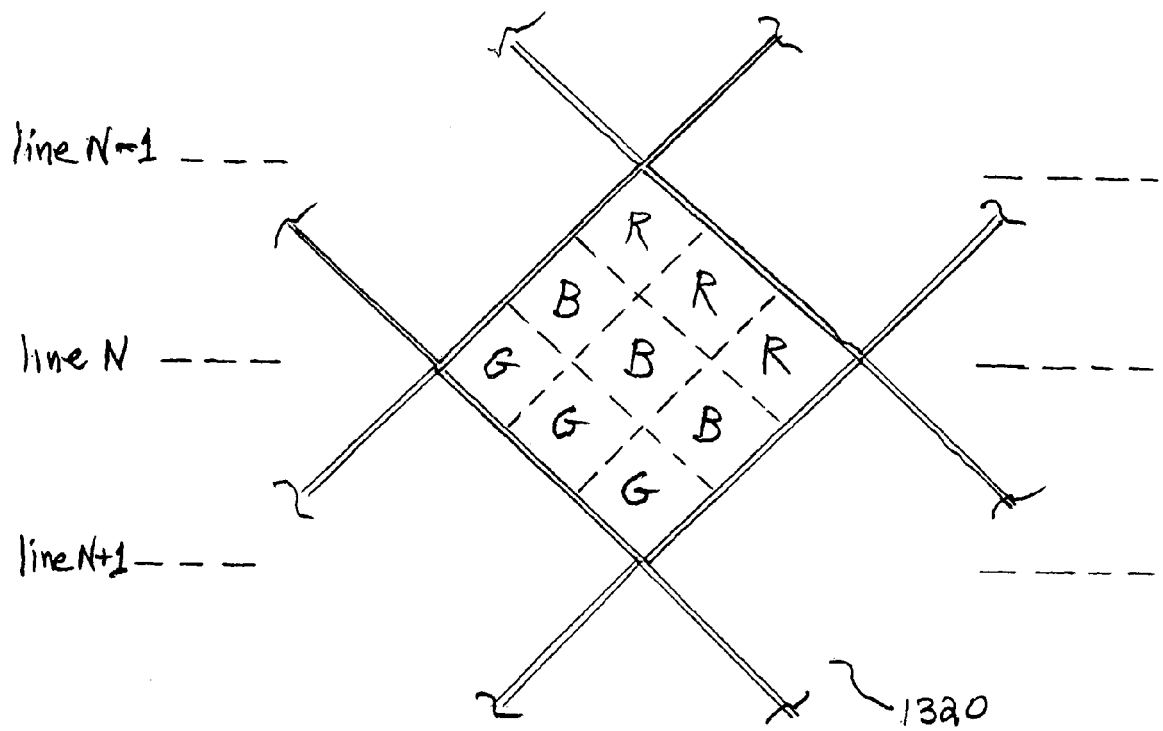
FIG. 13 is a diagram of a portion of a lenticular array, also illustrating color sub-pixels, in accordance with another embodiment of the invention.

FIG. 13 shows a variation of the FIG. 12 embodiment that uses lenticles, 1320, which have nine times larger area; that is, each lenticle covers a group of nine sub-pixels and nine corresponding color filter sub-regions. This arrangement can provide an advantage of improved moiré pattern avoidance by virtue of having the effective cutoff of the optical prefilter (i.e., the lenticular lens array) nearer to the ideal spatial frequency cutoff value.

Figure 14:
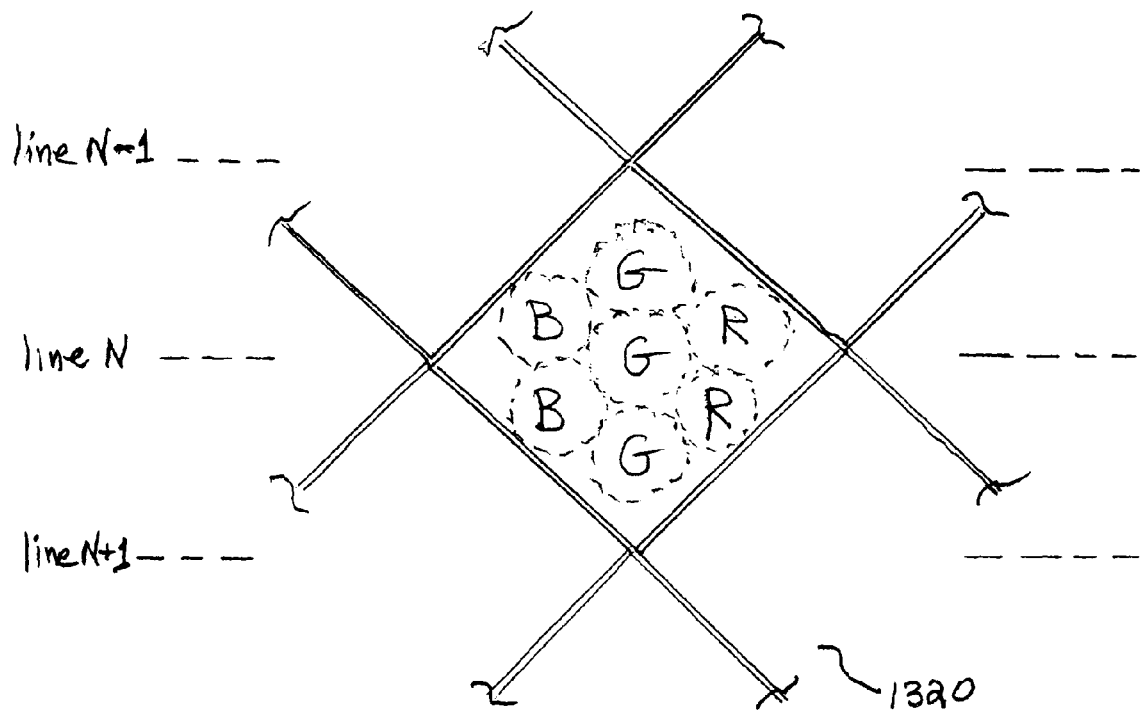
FIG. 14 is a diagram of a portion of a lenticular array, also illustrating color sub-pixels, in accordance with still another embodiment of the invention.

A further variation, which also uses the larger lenticles, has seven sub-pixels and a group of seven round color filter subgroups, as shown in FIG. 14. The circular sub-pixels provide a good match with the imaging of the circular aperture (e.g. 106 in FIG. 11) of the camera optical subsystem.

The invention claimed is:

1. A method for producing video signals representative of an image of a scene, comprising the steps of:

providing an image sensor having a pixel pattern comprising groups of sub-pixels;

providing a color filter pattern comprising a sub-pixel pattern of colors over each group of sub-pixels;

providing a lenticular lens array, and projecting the image onto the image sensor via said lenticular lens array and said color filter pattern, the lenticular lens pattern of said lenticular lens array having a diamond-shaped lenticle for each group of sub-pixels, each side of the diamond-shaped lenticles of said array being diagonally oriented with respect to the horizontal scanning direction of said pixel element pattern; and producing image-representative video signals by reading out signals from the pixel elements of said image sensor.

2. The method as defined by claim 1, wherein said groups of sub-pixels are diamond-shaped sub-pixels.

3. The method as defined by claim 1, wherein said diamond-shaped lenticles are substantially contiguous along each diagonal of said lenticular lens pattern.

4. The method as defined by claim 2, wherein said diamond-shaped lenticles are substantially contiguous along each diagonal of said lenticular lens pattern.

5. The method as defined by claim 3, wherein said sub-pixel pattern of colors comprises a diamond shaped sub-pixel pattern of red, blue, and green filter components.

6. The method as defined by claim 4, wherein said sub-pixel pattern of colors comprises a diamond shaped sub-pixel pattern of red, blue, and green filter components.

7. The method as defined by claim 1, wherein said group of sub-pixels comprises seven sub-pixels.

8. The method as defined by claim 2, wherein said diamond shaped group of sub-pixels comprises nine sub-pixels.

9. The method as defined by claim 2, wherein said step of providing a color filter pattern comprises providing a diamond-shaped pattern of colors over each group of sub-pixels.

10. The method as defined by claim 1, wherein said step of providing a color filter pattern comprises providing a circular-shaped pattern of colors over each group of sub-pixels.

11. The method as defined by claim 4, wherein said diamond shaped group of sub-pixels comprises nine sub-pixels.

12. The method as defined by claim 2, wherein said sub-pixel pattern of colors comprises a diamond shaped sub-pixel pattern of red, blue, and green filter components.

* * * * *